United States Patent
Sterner

(10) Patent No.: US 6,253,834 B1
(45) Date of Patent: Jul. 3, 2001

(54) APPARATUS TO ENHANCE COOLING OF ELECTRONIC DEVICE

(75) Inventor: John R. Sterner, Albany, OR (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/181,720

(22) Filed: Oct. 28, 1998

(51) Int. Cl.⁷ .................................................. F28F 7/00
(52) U.S. Cl. ..................... 165/80.3; 165/104.34; 165/123; 257/721; 361/687; 361/692; 361/695; 174/16.3
(58) Field of Search .................. 165/80.3, 80.4, 165/104.33, 104.34, 121, 122, 123, DIG. 300, DIG. 301; 361/687, 696, 699, 691, 693, 692, 694, 695; 257/721, 722; 174/16.3

(56) References Cited

U.S. PATENT DOCUMENTS

| | | | |
|---|---|---|---|
| 3,194,307 | * 7/1965 | Wood | 165/DIG. 301 X |
| 3,422,898 | * 1/1969 | Coleman et al. | 165/123 |
| 4,233,644 | 11/1980 | Hwang et al. | 361/384 |
| 4,417,295 | 11/1983 | Stuckert | 361/384 |
| 4,628,992 | 12/1986 | Kennedy | 165/123 |
| 4,672,509 | 6/1987 | Speraw | 361/384 |
| 4,674,004 | 6/1987 | Smith et al. | 361/384 |
| 4,742,864 | 5/1988 | Duell et al. | 165/1 |
| 4,896,716 | 1/1990 | Sotani et al. | 165/54 |
| 4,953,634 | * 9/1990 | Nelson et al. | 165/80.3 X |
| 5,029,236 | 7/1991 | Yasuda et al. | 455/90 |
| 5,195,576 | * 3/1993 | Hatada et al. | 165/80.3 |
| 5,294,831 | * 3/1994 | Azar et al. | 165/80.3 X |
| 5,313,362 | * 5/1994 | Hatada et al. | 165/80.3 X |
| 5,370,178 | * 12/1994 | Agonnfer et al. | 165/80.3 X |
| 5,493,457 | 2/1996 | Kawamura et al. | 369/75.1 |
| 5,597,035 | * 1/1997 | Smith et al. | 165/80.3 |
| 5,646,822 | 7/1997 | Bhatia et al. | 361/687 |
| 5,676,198 | 10/1997 | Schneider et al. | 165/80.3 |
| 5,691,893 | * 11/1997 | Nelson | 165/80.3 X |
| 5,765,743 | * 6/1998 | Sakiura et al. | 165/80.3 X |
| 5,894,987 | * 4/1999 | Layne et al. | 165/80.3 X |

FOREIGN PATENT DOCUMENTS

363221655 * 7/1988 (JP) ................................ 165/80.4

OTHER PUBLICATIONS

Computer Packaging Technology: "Diffuser Improves Computer Cooling; A Diffuser at the Cabinet Exhaust Converts Dynamic Head to Static Pressure"; by: Douglas A. Bailey, Digital Equipment Corp.; Jan. 1994; pp. 42–43.

IBM Technical Disclosure Bulletin: "XP–002138516—Uninterruptible Modular Air–Cooled System"; by: R.C. Chu & R.E. Simons; vol. 15, No. 12, May 1973; pp. 3654–3655.

* cited by examiner

Primary Examiner—Christopher Atkinson
(74) Attorney, Agent, or Firm—Timothy F. Myers

(57) ABSTRACT

An electronic device has at least one component that is capable of generating a quantity of heat. The electronic device further has an air-moving device and an air duct. The air moving device is capable of creating a flow of air that removes a portion of the quantity of heat. The flow of air enters the air duct. The air duct has a restriction chamber that includes a venturi vent in which the flow of air into the duct and through the restriction chamber creates a new flow of air into the venturi vent. The new flow of air into the venturi vent does not pass over the at least one component in the electronic device.

12 Claims, 12 Drawing Sheets

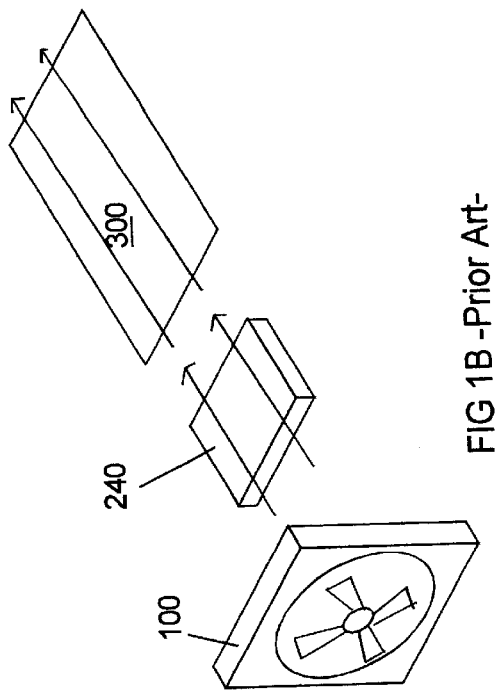
FIG. 1A -Prior Art-
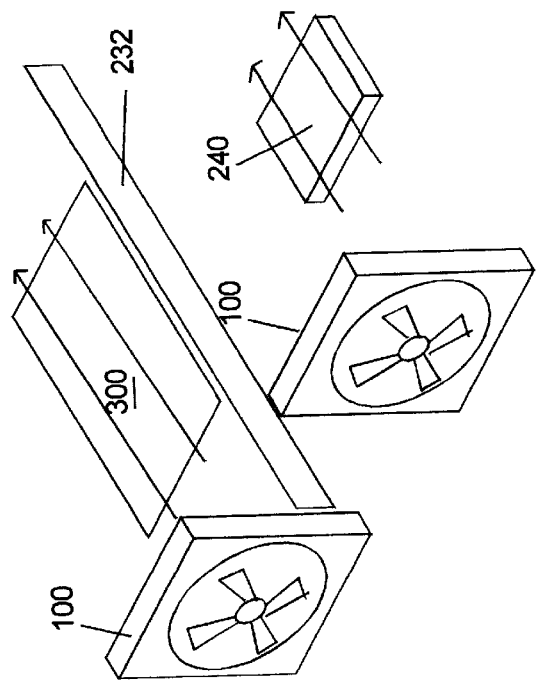
FIG 1B -Prior Art-
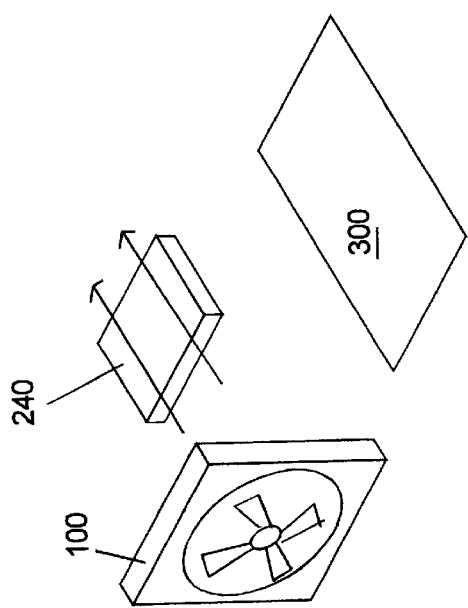
FIG 1C -Prior Art-
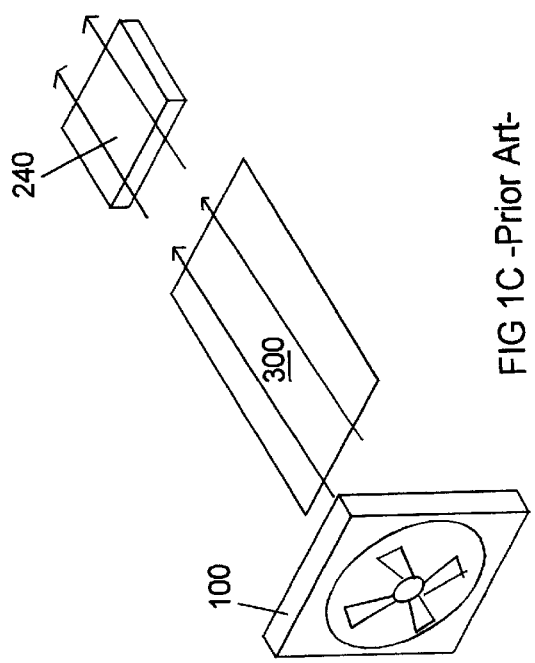
FIG 1D -Prior Art-

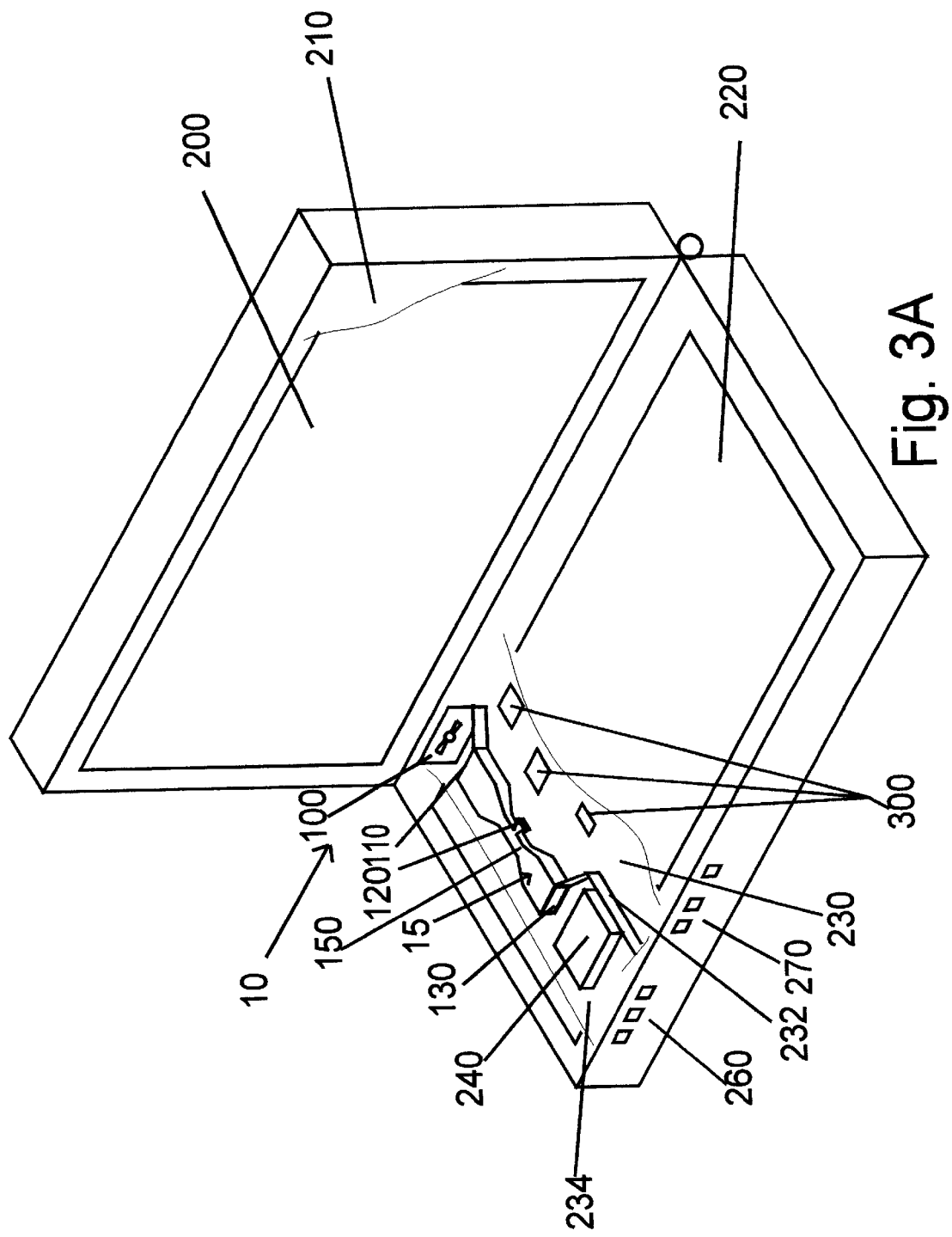

APPARATUS TO ENHANCE COOLING OF ELECTRONIC DEVICE

FIELD OF THE INVENTION

This invention relates to a heat transfer system. More specifically, it relates to using a venturi to create separate air flows in an electronic device to cool components.

BACKGROUND OF THE INVENTION

Many electronic devices have inadequate thermal management. They either get too hot for comfort or so hot that component or system reliability is reduced. Many customers of electronic devices are starting to recognize that manufacturers are cutting corners in thermal design as processor speeds keep increasing. FIGS. 1A through 1D represent different prior art approaches using fans by several manufacturers.

FIG. 1A illustrates one prior art approach to cooling a heat producing component 240 in an electronic device such as a notebook computer. An air-moving device 100, such as a fan or blower, blows air across the heat producing component 240 and the air then exits the electronic device. While this approach cools the heat producing component, it ignores the rest of the system components 300 which typically comprise one half to two thirds of the system thermal load.

FIG. 1B illustrates another prior art approach in which the air from air-moving device 100 that cools heat producing component 240 passes over system components 300 before exiting the electronic device. The result of this approach is that the system components 300 are heated by the warm heat producing component 240 air flow and this heating may cause some of the system components 300 to fail prematurely. Additionally, the air that does exit the electronic device is warmer than desired, often to the detriment of the user's comfort.

FIG. 1C illustrates an alternative prior art arrangement where the cool outside air pulled into the electronic device by air-moving device 100 passes over system components 300 before this air passes across heat producing component 240. While system components 300 are kept cooler, the efficiency on cooling heat producing component 240 decreases because the air reaching it is warmed by system components 300. Again, the air exiting the electronic device is warmer than desired causing user discomfort.

FIG. 1D illustrates a prior art approach to creating two separate air flows for the electronic device 240 and system components 300 by using two fans 100, one for each heat source and separated by wall 232. This approach is difficult to implement in smaller electronic devices because it is more expensive, it has higher power consumption and it needs more space for each fan.

Therefore, while fans or blowers have been used in may different configurations as cooling solutions in electronic devices, such as notebook computers, a need exists when using a single fan or blower to separate cooling flows of outside air for the CPU and the rest of the system.

SUMMARY OF THE DISCLOSURE

An electronic device has at least one component that is capable of generating a quantity of heat. The electronic device further has an air-moving device and an air duct. The air moving device is capable of creating a flow of air that removes a portion of the quantity of heat. The flow of air enters the air duct. The air duct has a restriction chamber that includes a venturi vent in which the flow of air into the duct and through the restriction chamber creates a new flow of air into the venturi vent. The new flow of air into the venturi vent does not pass over the at least one component in the electronic device.

In one embodiment, the new flow of air is used to cool additional components in the electronic device.

In another embodiment, the air duct is combined with the at least one component to form a processor module used in the electronic device.

BRIEF DESCRIPTION OF THE DRAWINGS

FIG. 1A illustrates a prior art approach to cooling a heat producing component.

FIG. 1B illustrates a first prior art approach to cooling both a heat producing component and other system components.

FIG. 1C illustrates a second prior art approach to cooling both a heat producing component and other system components.

FIG. 1D illustrates a prior art approach to create to airflows using dual fans.

FIG. 3A illustrates the preferred embodiment of the invention showing an electronic device using the air duct with the venturi vent of FIG. 2.

DETAILED DESCRIPTION OF THE PREFERRED AND ALTERNATE EMBODIMENTS

The invention solves a difficult cooling problem in electronic devices in an elegant manner. Separate cooling flows are created using a venturi vent in which a heat producing component, such as a CPU, microprocessor or processor module, is cooled independent of the rest of the system components. Additionally, this venturi vent technique extends to solve other difficult thermal issues. The invention addresses the need for separate air flows by using an air-moving device, such as a fan or blower, to create an air flow having an air velocity and then a restriction chamber to create a low pressure zone using the Bernoulli principle to create a vacuum air flow in a venturi vent which is used to evacuate either warm air from inside the product or to draw in cooler air from outside the product.

Figure 2:
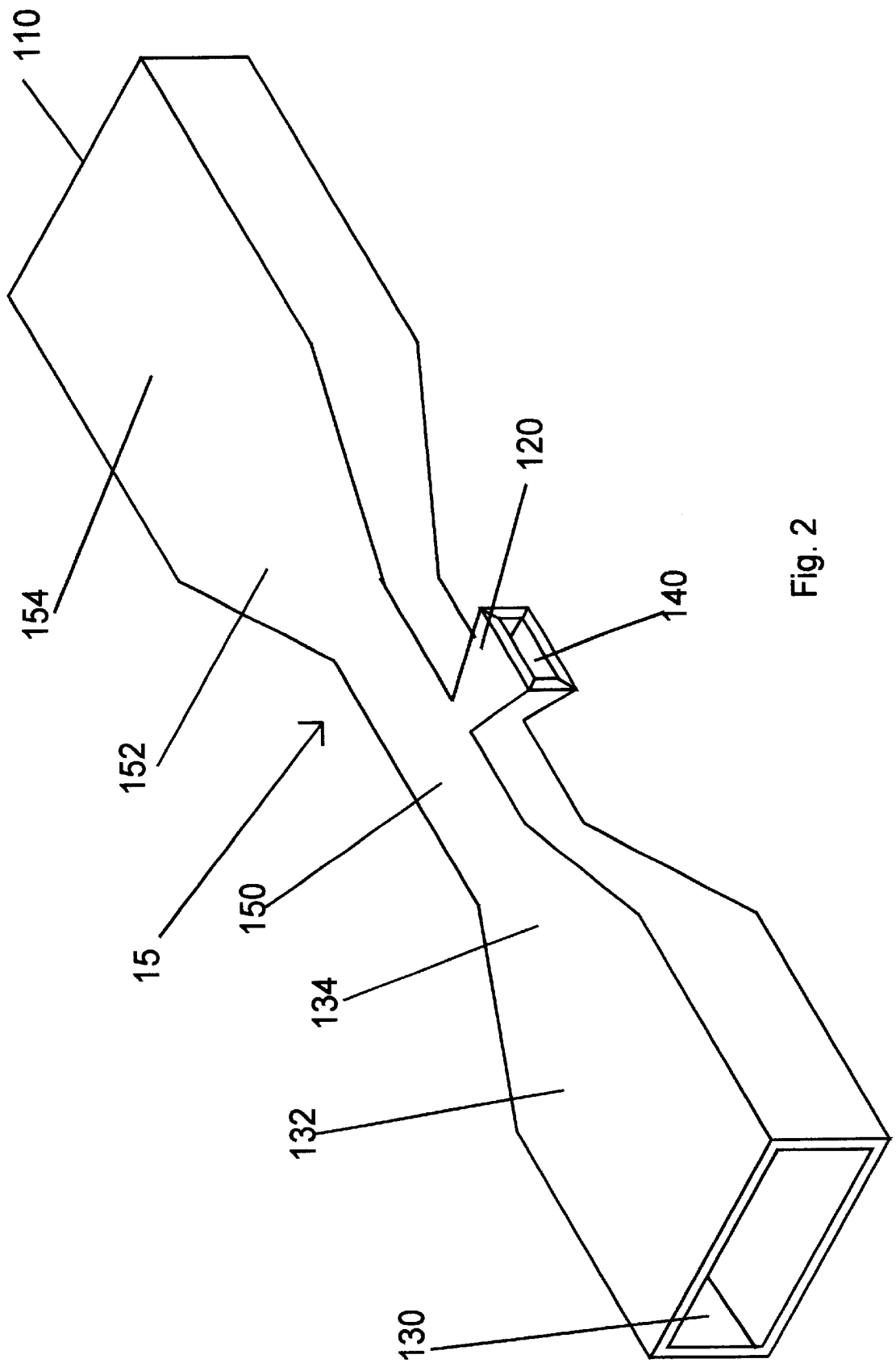
FIG. 2 illustrates an air duct having a venturi vent and its various components as used in the preferred embodiment of the invention.

FIG. 2 illustrates an air duct 15 that comprises a venturi vent 120. The venturi vent 120 has an opening 140, that is preferably flared, and which helps to couple and operatively engage air external to the air duct 15 into the venturi vent 120. The air duct 15 has an intake manifold 130 in which air is drawn into the air duct 15. The intake manifold 130 has a first volume 132 comprised of a first area and a first length. Air within the first volume is compressed as it leaves the intake manifold 130 and is coupled with first coupling 134 into restriction chamber 150. As the air is compressed, its speed or velocity must increase to conserve the amount of air mass moving through the air duct 15. When the velocity increases in the restriction chamber 150, the air pressure against the sidewalls of the air duct 15 in restriction chamber 150 reduces. This reduction in pressure as the air velocity increases is known as the Bernoulli principle. By controlling the amount of restriction of the air and thus its velocity, the ability to control the reduction in the air pressure is greatly increased leading to design flexibility. The restriction chamber 150 further has an opening or optionally a flared opening 140 on at least one sidewall to create a venturi vent 120. This venturi vent 120 then allows air outside of the air duct 15 to enter the opening thus allowing air outside of air duct 15 to mix with the air entering the intake manifold 130. This mixed air is operatively engaged by being coupled through a second coupling 152 to an exhaust manifold 110 where it exits air duct 15. The exhaust manifold 10 has a second volume 154 that comprises a second area and a second length. As the mixed air enters the exhaust manifold 110 it expands and thus slows its velocity, thereby increasing the pressure on the sidewalls and reducing the pressure differential between air inside the exhaust manifold 110 and the outside air. This normalization of pressure increases the effectiveness of moving air from the exhaust manifold 110 to outside of the air duct 15.

FIG. 3A is an illustration of the preferred embodiment in which an electronic device 10, such as a notebook computer, implements the air duct 15 of FIG. 2. The electronic device 10 comprises a keyboard 220 and display 200. The display 200 has a cavity 210. The keyboard 220 has an enclosure or cavity 234 which contains at least one heat producing component 240, such as a microprocessor, graphics controller, memory device or combination thereof, and an air duct 15 which has a venturi vent 120, an intake manifold 130 and an exhaust manifold 110. Air is pulled through the air duct 15 by the use of an air-moving device 100, such as a fan or blower. In this embodiment the air-moving device 100 is proximal to the exhaust manifold 110 of the air duct 15. The heat producing component 240 is thermally isolated from the system components in keyboard cavity 230 by a barriers 232 to form an enclosure. Air outside of electronic device 10 is drawn into the keyboard cavity 230 through a first set of air vents 260 and a second set of air vents 270. The first set of air vents 260 direct air over heat producing component 240, while the second set of air vents 270 directs air over system components 300 in cavity 230. Thus, two separate air flows are created which are separated by barriers 232. The first air flow over heat producing component 240 enters intake manifold 130 of air duct 15 and is constricted in a restriction chamber 150 such that venturi vent 120 creates a vacuum suction force for the second air flow which draws in air from cavity 230 to cool the system components 300. The two air flows are mixed in exhaust manifold 110 before being expelled out of electronic device 10 by air-moving device 100.

Figure 3B:
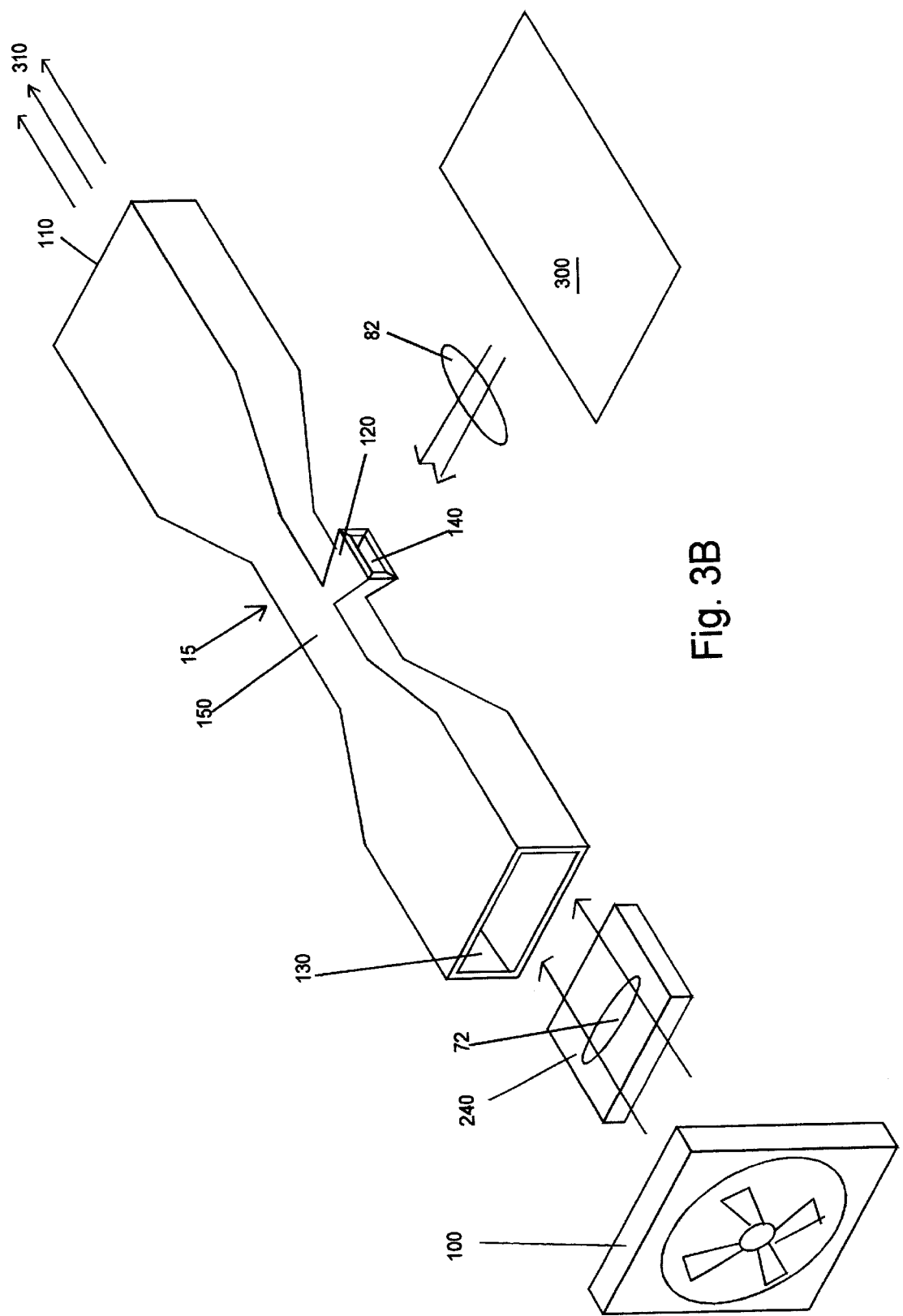
FIG. 3B illustrates another embodiment of the invention in which an air moving device is proximal to the intake manifold of the air duct.

Alternatively, as shown in the embodiment of FIG. 3B, the air-moving device 100 is placed near the first air vents 260 (FIG. 3A) and proximal to intake manifold 130 to push air stream 72 across heat producing component 240 before entering intake manifold 130. This air stream 72 is compressed in restriction chamber 150 to create a vacuum air flow 82 into venturi vent 120 through flared opening 140, thus drawing in air from system components 300 in the keyboard cavity 230 (FIG. 3A). The air from air-moving device 100 and the venturi vent 120 are mixed and exhausted as exhaust air flow 310 from exhaust manifold 110 directly out of the electronic device 10 (FIG. 3A).

Optionally, rather than pulling air across system components 300, vacuum air flow 82 can be drawn in to the venturi vent 120 from outside the electronic device 10 to mix with the air stream 72 from across heat producing component 240 in order to cool the air before it exits the electronic device 10, thereby making the exhaust air flow 310 more comfortable to the user.

Figure 4:
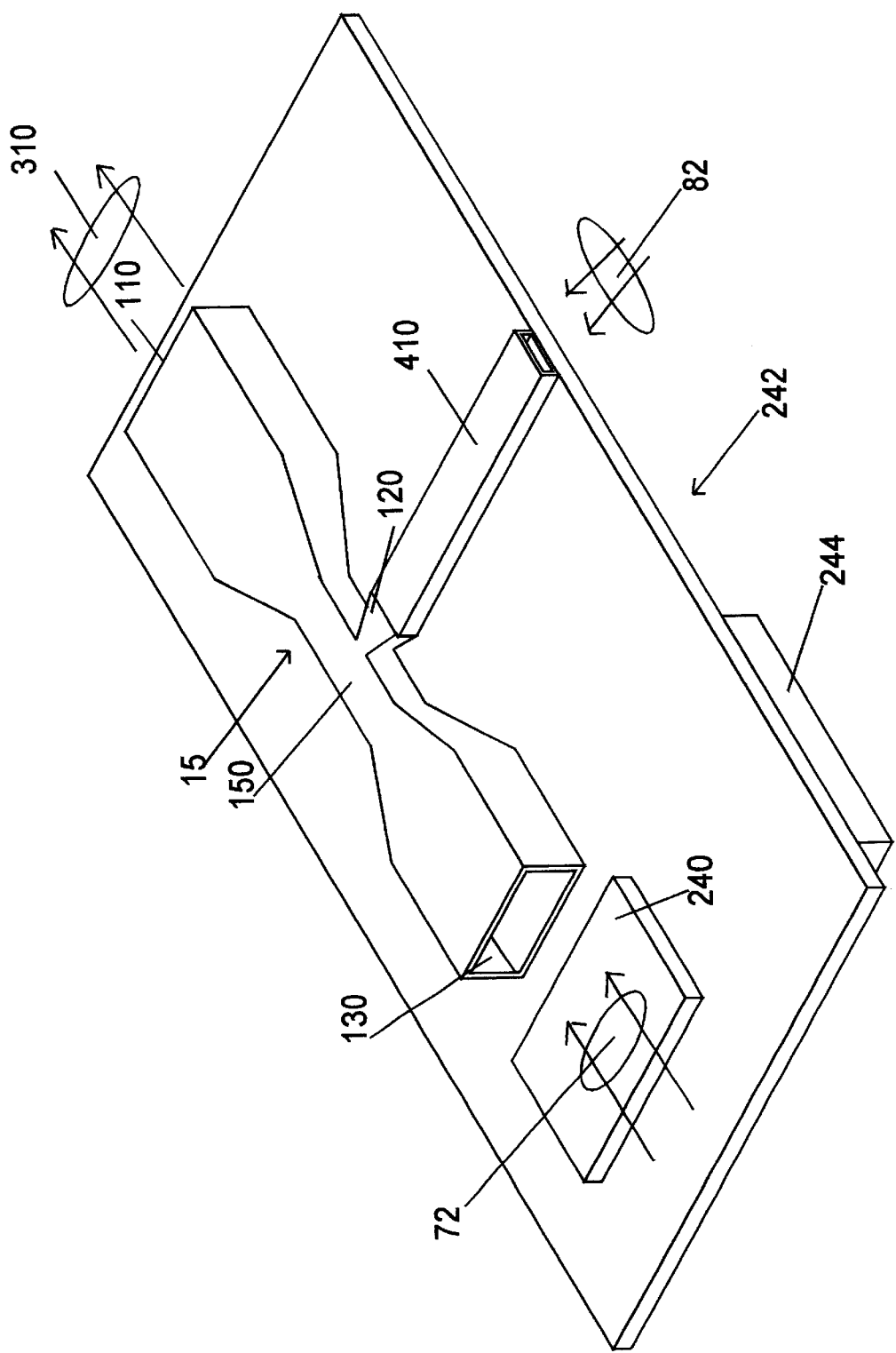
FIG. 4 illustrates a first alternative embodiment of the invention in which the air duct is part of a processor module.

Since processors are capable of being the largest heat generating component in electronic devices, it is difficult to design an electrical and thermal interface to them. To make this design task easier, manufacturers are now tending to sell processors in modules combined with other components. FIG. 4 illustrates a first alternate embodiment of the invention in which air duct 15 is shown as integral to a processor module 242 having a heat producing component 240, such as a processor, and a module connector 244 for interfacing additional electronics to processor module 242. An air stream 72 is directed over heat producing component 240 and is operatively engaged as it enters intake manifold 130. This air stream 72 is compressed in restriction chamber 150 causing a vacuum air flow 82 to flow into venturi vent 120. Optionally, a second duct 410 is used to couple and operatively engage the venturi vent 120 with the electronic device as part of the module's air interface by the electronic device's designer. The vacuum air flow 82 is mixed with the air stream 72 and expelled from the exhaust manifold 110 as exhaust air flow 310.

Figure 5:
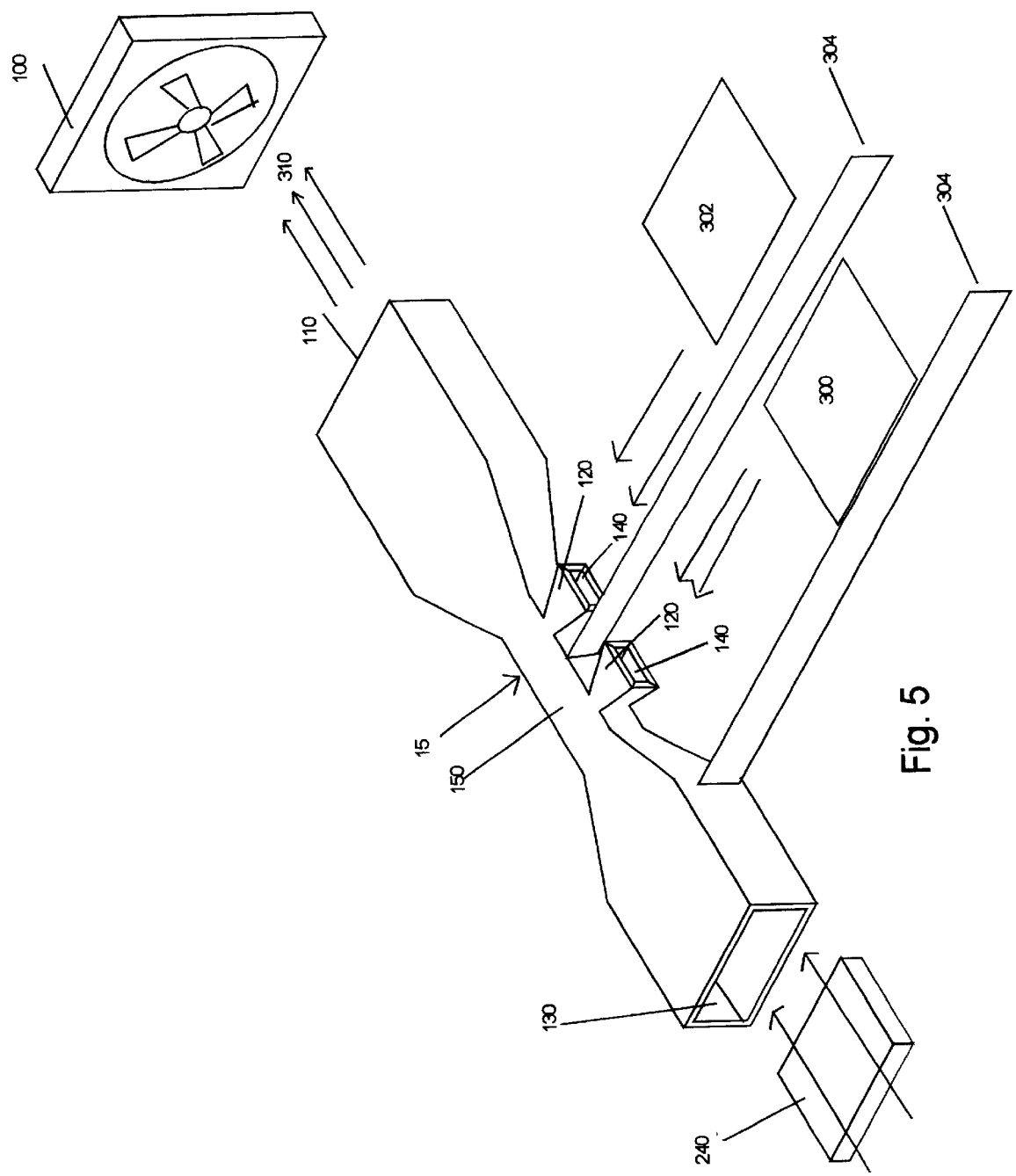
FIG. 5 illustrates a second alternative embodiment of the invention using multiple venturi vents.

FIG. 5 shows a second alternative embodiment which has more than one venturi vent to create additional air flows used to cool sensitive components 302 or to draw air from outside the electronic device 10 (FIG. 3A) to cool the mixed air flow from the heat producing component 240 and system components 300. To keep the venturi air flows separate, multiple barriers 304 are used.

Figure 6:
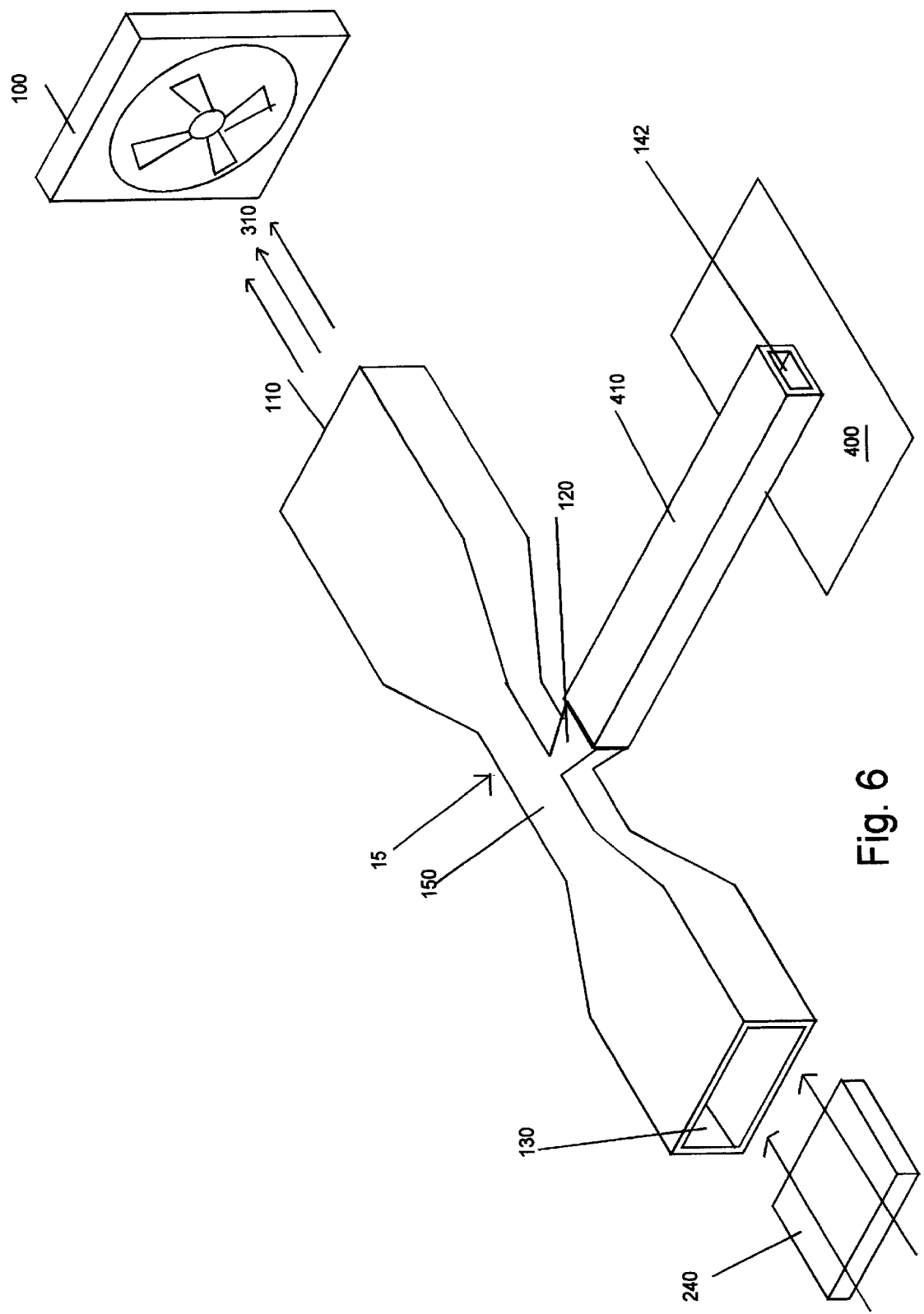
FIG. 6 illustrates a third alternative embodiment of the invention using a second duct to couple air to the venturi vent.

FIG. 6 illustrates a third alternative embodiment in which the barrier function is performed by a second duct 410, having an opening 142, which can be used to direct air into the venturi vent 120 from anywhere in the electronic device 10 (FIG. 3A), for example, such as the display cavity 210 (FIG. 3). The second duct 410 may be comprised of rigid or flexible material.

Figure 7:
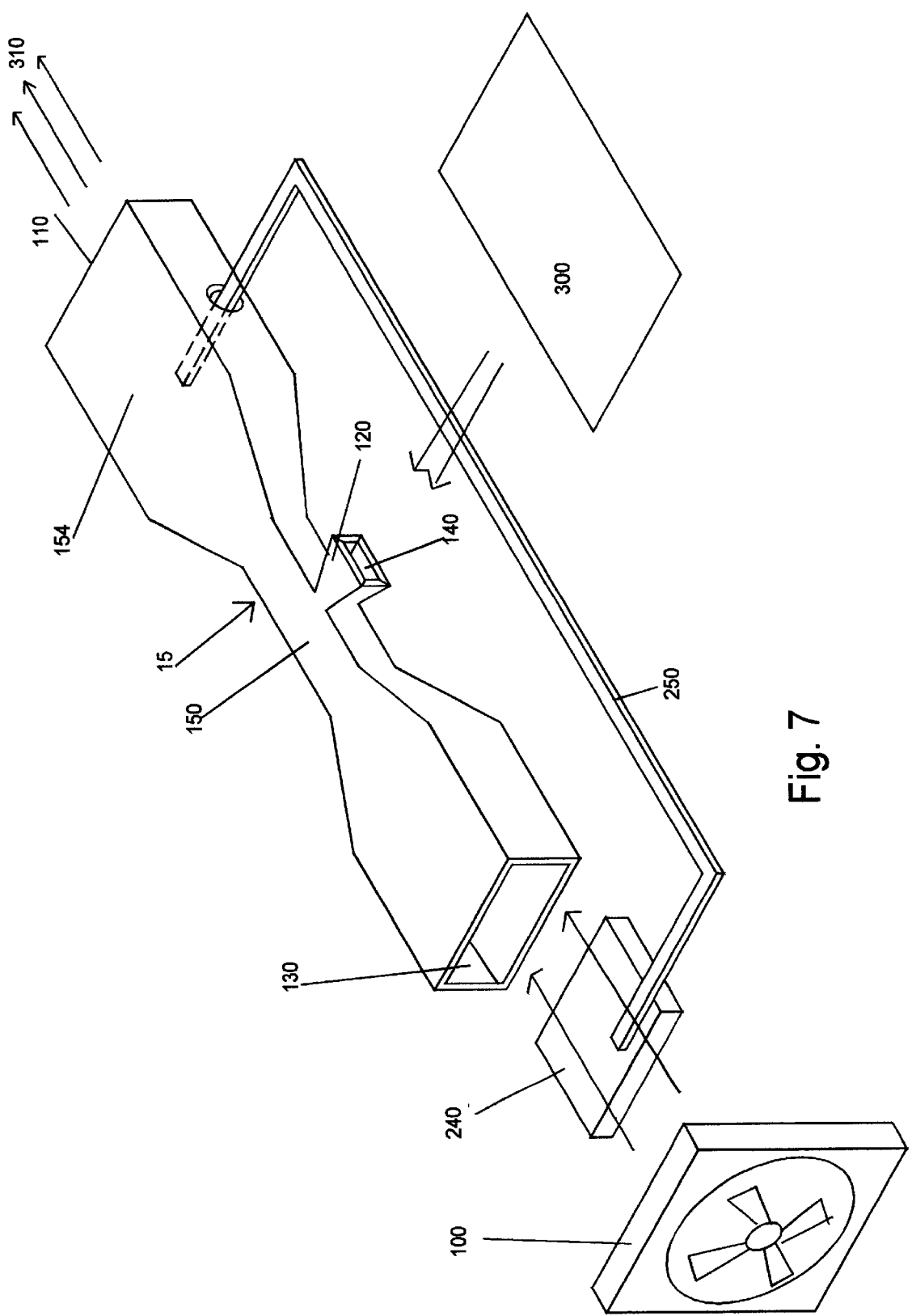
FIG. 7 illustrates a fourth alternative embodiment of the invention used in conjunction with a heat pipe.

FIG. 7 illustrates a fourth alternative embodiment, which combines the venturi vent 120 with a heat pipe 250. In this embodiment, heat from the heat producing component 240 is removed by the heat pipe 250 and with the air that is blown over the heat producing component 240 from air-moving device 100. The heated air from heat producing component 240 enters the intake manifold 130 to create the vacuum air flow through the venturi vent 120 when the air is compressed in restriction chamber 150. The vacuum air flow may be used to create an air flow over the system components 300 or it may be used to draw in air outside of electronic device 10 (FIG. 3A) to cool the warm air extracted from the heat producing component 240. The condensing end of the heat pipe 250 is thermally coupled to the exhaust manifold volume 154 such that the air that passes over the condensing end extracts heat before exiting out of exhaust manifold 110. This embodiment allows more heat to be extracted from the heat producing component 240 and the heat to be operative engaged to the exhaust air flow 310 through thermal coupling with the heat pipe 250.

Figure 8:
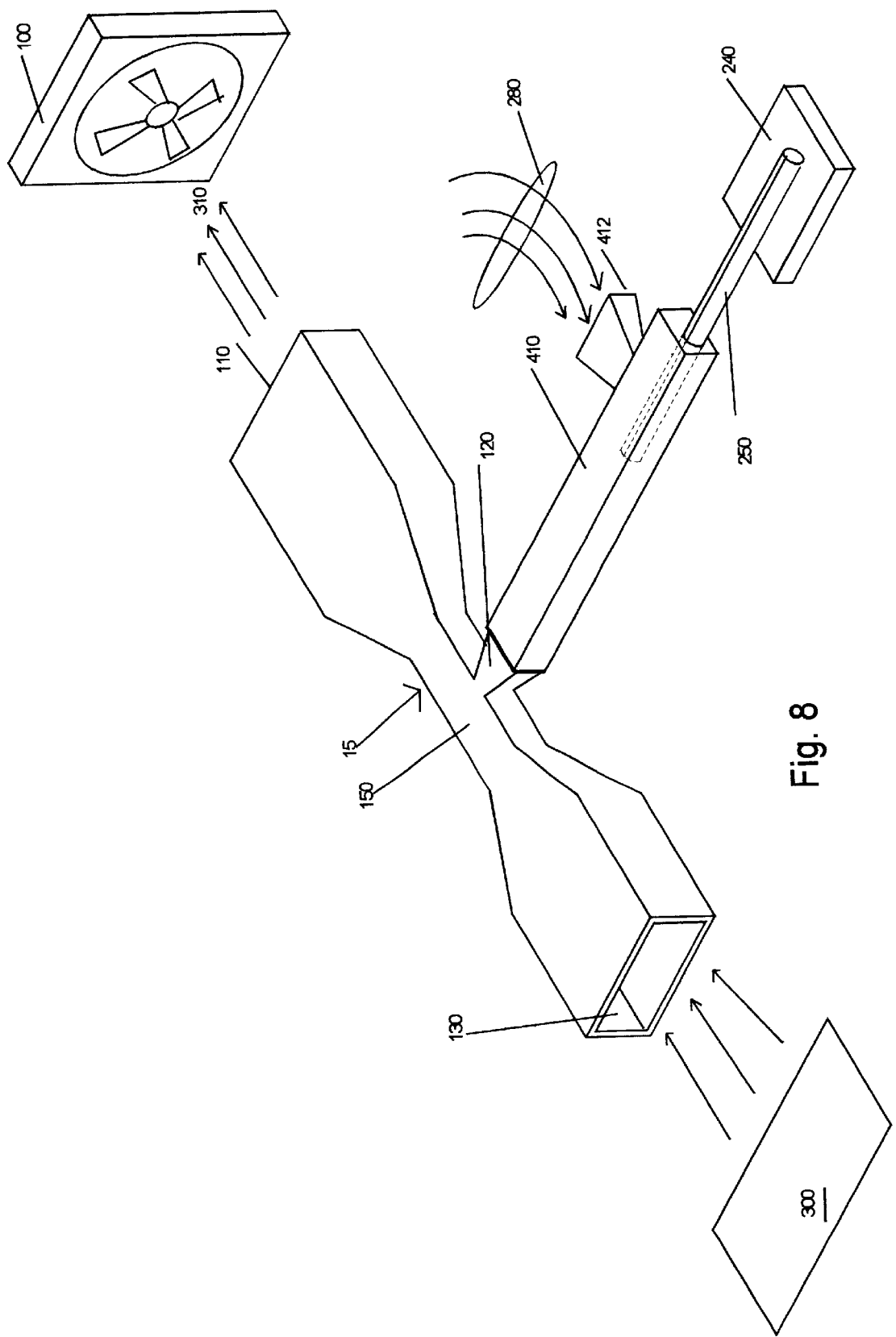
FIG. 8 illustrates a fifth alternative embodiment of the invention in which the heat pipe is coupled to the venturi vent through a second duct.

FIG. 8 illustrates a fifth alternative embodiment in which the system components 300 are cooled by creating an air flow into intake manifold 130 by air-moving device 100 which pulls an exhaust air flow 310 from exhaust manifold 110. The vacuum air flow created in restriction chamber 150 is coupled to a second duct 410, which is preferably further coupled to the condensing end of a heat pipe 250. Heatpipe 250 is thermally coupled to heat producing component 240, which is preferably separated from system components 300 by a cavity or enclosure (not shown). The second duct 410 further has an opening 412 used to draw in outside air 280, which is air external from electronic device 10 (FIG. 3A). When using heat pipe 250, the outside air 280 removes heat from the condensing end of the heat pipe before being drawn into venturi vent 120. Otherwise, if no heat pipe is used, the outside air flows over heat producing component 240 before entering opening 412.

Figure 9:
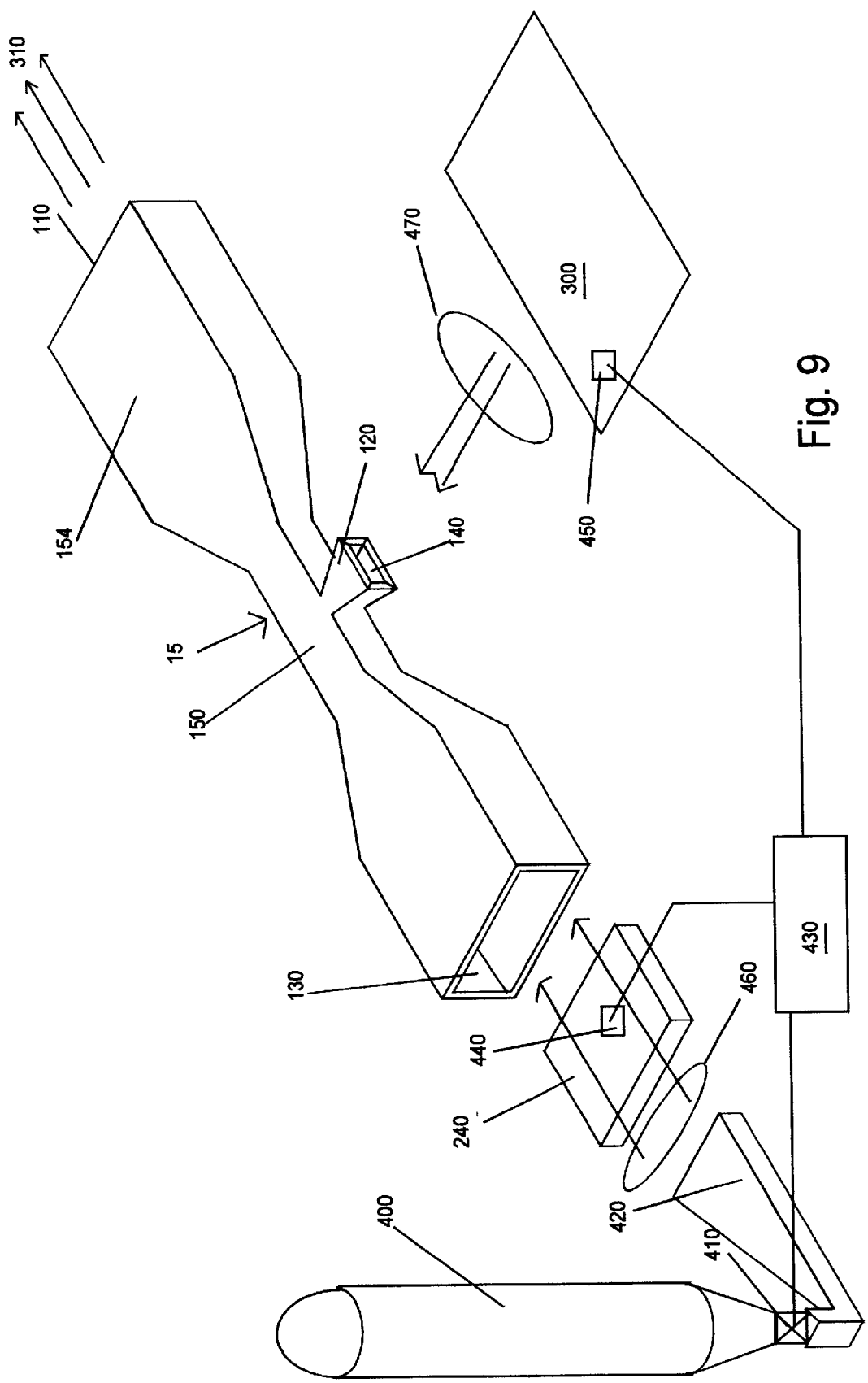
FIG. 9 illustrates a sixth alternative embodiment of the invention in which a compressed gas container creates the air flow, which generates the vacuum air flow in the venturi vent that cools the heat producing component.

FIG. 9 illustrates a sixth alternative embodiment in which the air-moving device comprises a compressed gas cartridge 400, the gas being any suitable compressed gas for cooling, such as compressed air or carbon dioxide, preferably carbon dioxide. The compressed gas release is controlled by a valve 410 that is activated by control circuit 430 that has a first temperature sensor 440 on heat producing component 240 and optionally, a second temperature sensor 450 monitoring system components 300. When the control circuit 430 detects that cooling is required, the compressed gas is released by opening valve 410 such that the compressed gas expands in flue 420. As the gas expands it absorbs energy thereby creating a cool air flow 460. This cool air flow crosses heat generating component 240 extracting heat from it into intake manifold 130 of air duct 15. This cool air flow 460 is compressed in restriction chamber 150 to create a vacuum air flow 470 into flared opening 140 of venturi vent 120. This vacuum air flow 470 is used to cool system components 300. The vacuum air flow 470 mixes with cool air flow 460 in the exhaust manifold volume 154 before exiting exhaust manifold 110 to become exhaust air flow 310.

An exemplary design for an air duct for use in a notebook computer is now provided. This exemplary design provides a first-pass method to get a rough approximation for design variables. Factors such as fan or blower efficiency, friction due to turbulence and surface contact, and unusual shapes necessary to implement some solutions are ignored in this example for the purposes of illustration. These factors must be taken into account in an actual design. Due to the difficulty in determining these factors, those skilled in the art are likely to either estimate the factors or resort to empirical testing to derive them. However, many times a design will be so complex that empirical testing of the desired results (e.g. the temperature of components), while modifying the air duct parameters, may be the only satisfactory design technique.

Figure 10:
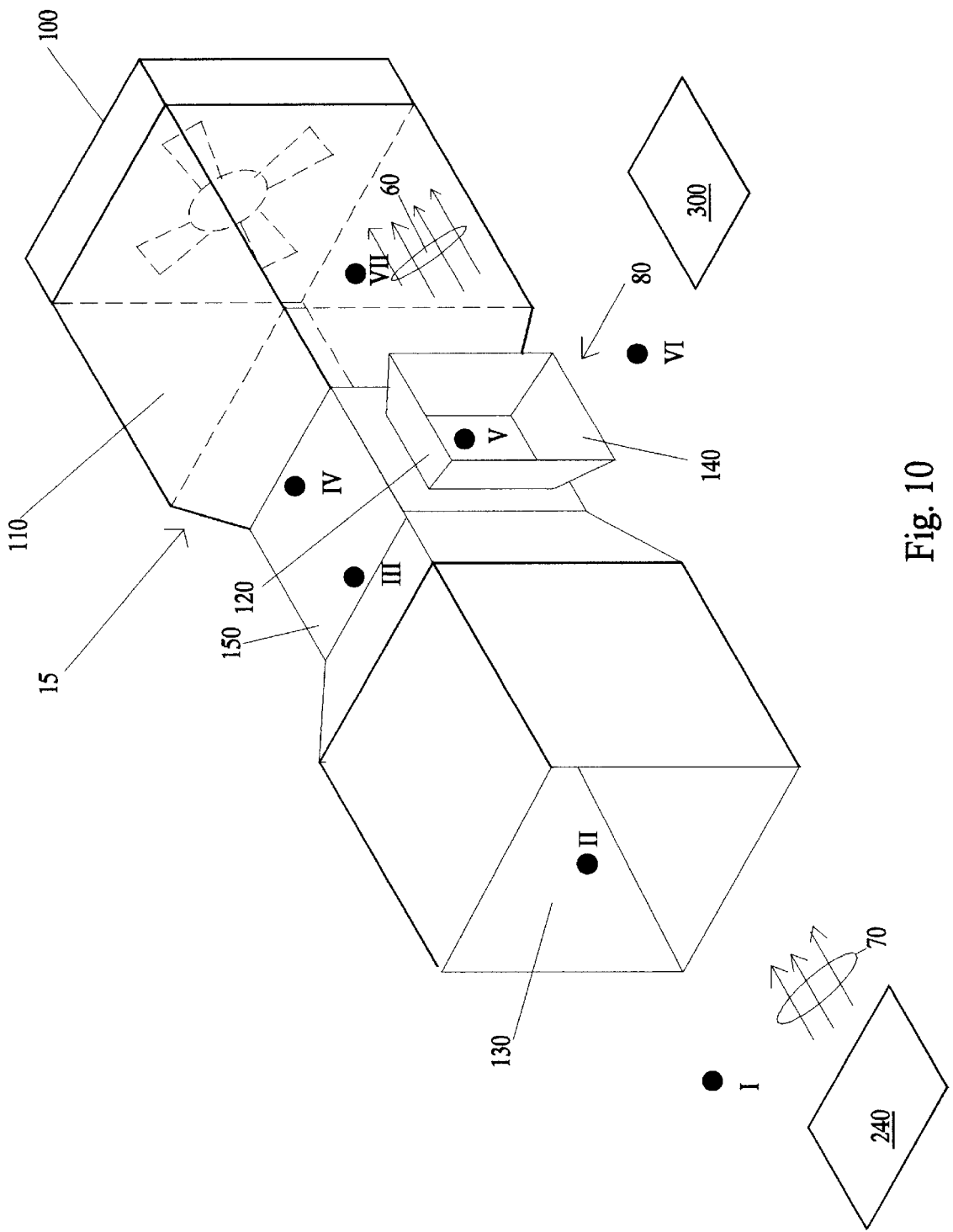
FIG. 10 is an isometric drawing of an air duct useful for designing an exemplary embodiment of the invention.
Figure 11:
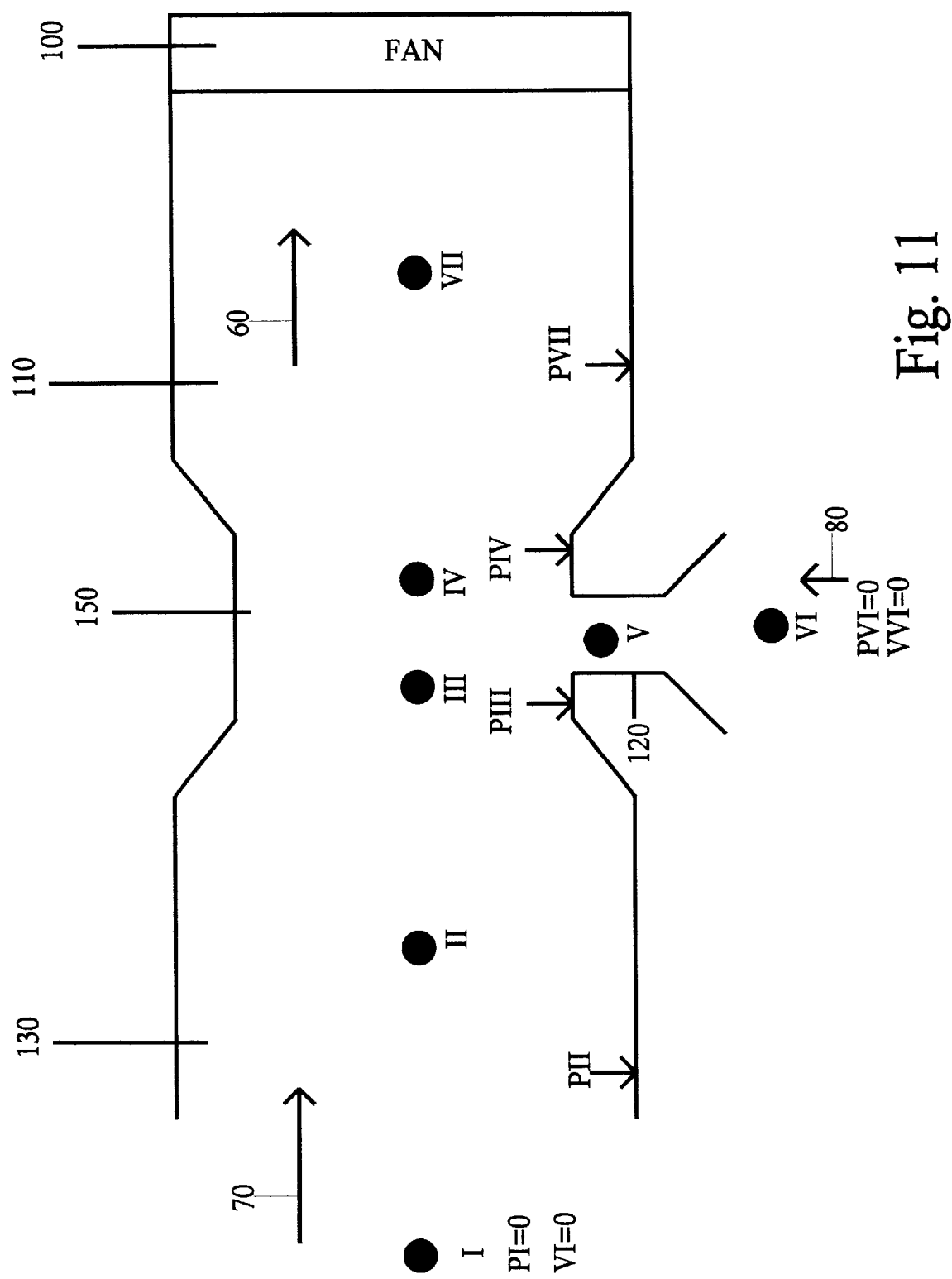
FIG. 11 is a cross section of the air duct in FIG. 10 which illustrates the various regions and pressure areas used for designing an exemplary embodiment of the invention.

When first-pass designing an exemplary air duct having a venturi vent, it is useful to separate different sections of the air duct into zones. FIG. 10 is an illustration showing an air duct broken into seven zones marked by a black dot and Roman numerals. FIG. 11 is a schematic representation of FIG. 10 showing the regions and the various pressure points on the air duct's interior walls. A brushless DC fan such as a Sunon EME fan and motor model # KDE0545PFS1–8 can be used for the air-moving device 100. This fan can provide up to 8 cubic feet per minute (CFM) of air flow and measures 45 mm×45 mm in area and 10 mm in thickness.

The heat removal rate (P) of a heat transfer system is equal to the mass flow rate of air (m) times the specific heat of air (Cp) times the difference in temperature air rise from inlet to exhaust air ($\Delta T$), i.e.

$$P = mCp\Delta T (\text{Watts})$$

The mass flow rate of air (m) can be expressed as the air density ($\rho$) times the volume flow rate of air (F), i.e.

$$m = \rho F$$

For air, the air density ($\rho$) is approximately 1.18 (Kg/m$^3$) at 25° C. The specific heat of air (Cp) is approximately 1005 (J/(kg–K)). Therefore, to maximize the heat removal rate (P), either the flow rate (F) and/or the difference in temperature ($\Delta T$) rise must be maximized.

To maximize $\Delta T$, the air to the heat producing component 240 needs to be as cool as possible and the surface area that the air contacts with the component as large as possible. For exemplary design purposes, it is assumed that the system components will typically require 8 Watts to be exhausted from a first cavity or enclosure and heat producing component 240 will typically require 24 Watts to be exhausted from a second cavity or enclosure. For convenience to the user (to keep from being burned or otherwise experience an electronic device that is unacceptably warm) the maximum air exhaust temperature differential ($\Delta T$) is preferably limited to 15° C. in this example (FIG. 9 illustrates an embodiment where $\Delta T$ can be greatly increased due to cool air flow 460). For conversion between the metric MKS system and English system of units, one cubic foot per minute (CFM) is equal to 4.72E–4 m$^3$/sec. Given the above, the volume flow rate of air for this example can be calculated. For the system components 300, 8 Watts need to be exhausted in this example, so to find the volume air flow to cool the system components 300, $F_{system\_comp.}$ 80:

$$P = 8 \text{ Watts} = \rho F Cp 15$$

then $$F_{system\_comp.} = 8/15 \ \rho Cp$$

$$F_{system\_comp.} = 8/(15)(1.18)(1008)*1/(4.72E^{-4}) = 0.953 \text{CFM} \approx 1 \text{CFM}$$

Likewise for the heat producing component 240, 24 Watts need to be exhausted in this example, so the heat producing component volume airflow $F_{heat\_prod.\_comp.}$ 70 is:

$$F_{heat\_prod.\_comp.} = 24/(15)(1.18)(1005)*1/(4.72E^{-4}) = 2.86 \text{CFM} \approx 3 \text{CFM}.$$

Therefore the fan needs to supply a total volume air flow 60 of 4 CFM of air flow in this example, which the Sunon KDE0545PFS1-8 can handle with its 8 CFM specification with margin for losses due to backpressure, air friction, restrictions, and outflows or leaks normally encountered and generally classified as a term called headloss. The headloss term is often related to the square of the velocity of the air moving through a region. Therefore it is difficult to determine precisely the headloss factor and it is either ignored in preliminary designs or assumed to be an energy loss across the boundaries of different regions.

Referring to FIG. 11, region I is outside of the air duct 15 and has a gage air pressure $P_I$ of zero(0) kg/m². Also far enough away from the intake manifold 130, the velocity of the air in region I is zero. The equation representing the conservation of energy between two regions is:

$$\frac{P_I}{\gamma} + \frac{V_I^2}{2g} = \frac{P_{II}}{\gamma} + \frac{V_{II}^2}{2g} + hl_{12}$$

where $\gamma$-specific weight of air $\sim$=12 kg/m²sec², g=gravitational constant of acceleration=9.8 m/sec², and $hl_{12}$=headloss from region I to region II. Since $P_I$=0 and $V_I$=0 and $V_{II}$=3CFM/(area of the intake manifold cross section), and ignoring the headloss term $hl_{12}$, $P_{II}$ can be determined. By setting the area of the intake manifold cross section to 2.025E−3 m² ((4.5 cm)² by design choice, which for this example is the fan area size), the pressure on the sidewalls of air duct 15 in region II is:

$$P_{II} = \frac{-(3*4.72E-4/2.025E-3)^2 *12}{2*9.8} = -0.3 N/m^2.$$

For the regions II and III, by the principle of conservation of mass, the velocities between the two regions are related by:

$$V_{III} = \frac{V_{II} * Area_{II}}{Area_{III}}$$

where $Area_{II}$ is the cross-sectional area of the intake manifold 130 in region II and $Area_{III}$ is the cross sectional area of the restriction chamber 150 in region III. Again, by design choice, setting the restriction chamber area to be two-thirds of the intake manifold area, e.g., $Area_{III}$=2/3*$Area_{II}$, then the pressure on the sidewalls of the restriction chamber in region III is:

$$P_{III} = \gamma\left(\frac{P_{II}}{\gamma} + \frac{V_{II}^2}{2g} - \frac{V_{III}^2}{2g} - hl_{23}\right)$$

where $hl_{23}$ is the friction headloss from region II to region III and for this example is ignored. Therefore, the pressure on the sidewalls of the restriction chamber in region III becomes:

$$P_{III} = P_{II} + (1-1.5^2)*\frac{V_{II}^2 \gamma}{2g}$$

$$P_{III} = -0.3 + (1-1.5^2)*\frac{\left(\frac{3*0.472E-3}{2.025E-3}\right)^2 *12}{2*9.8} = -0.67 N/m^2$$

Now for the regions V and VI, we want an air flow 80 of 1 CFM. It can be assumed that the pressure $P_{VI}$=0 and the velocity in region VI away from the venturi opening 140 is $V_{VI}$=0. Since we approximately know the pressure at the opening of the venturi vent 120, $P_v$, at the restriction chamber 150 as $P_{III}$ and assuming $P_{VI}$=0, the area of the cross section of the venturi vent can be calculated. Using the conservation of energy equation with the above assumptions and $V_v$=$F_v$/$Area_v$, the cross section area of the venturi vent is:

$$\frac{P_v}{\gamma} + \frac{V_v^2}{2g} - hl_{56} = 0$$

where $hl_{56}$ = headloss from region V to region VI and is ignored.

and is ignored.

$$V_v = \sqrt{\frac{-P_v * 2g}{\gamma}} = \frac{F_v}{Area_v}$$

$$Area_v = \frac{F_v}{\sqrt{-P_v * 2g/\gamma}} = \frac{1*0.472E-3}{\sqrt{0.67*2*9.8/12}} = 4.5E-4 m^2$$

Therefore, for a square opening, each side would be approximately 21 mm.

Examining the regions III and IV, we know that the $V_{III}$=3 CFM/$Area_{III}$ and $V_{IV}$=4 CFM/$Area_{IV}$ and assuming that the $Area_{III}$=$Area_{IV}$ the pressure on the sidewalls in region IV, $P_{IV}$, can be calculated (ignoring any headloss between region III and region IV) as:

$$P_{IV} = P_{III} + \frac{F_{III}^2 \gamma}{Area_{III}^2 * 2g} - \frac{F_{IV}^2 \gamma}{Area_{IV}^2 * 2g} = -1.2 N/m^2$$

This $P_{IV}$ is the pressure on the sidewalls on the opposite side of the venturi vent 120 from region III.

For the regions IV to VII, we know that the fan area is (4.5 cm)² so if the exhaust manifold is made to mate directly to the fan, $Area_{VII}$=(4.5 cm)² and $Area_{IV}$=$Area_{III}$=2/3 *$Area_{II}$. The velocity of air in region VII is 4 CFM/$Area_{VII}$ and the velocity of air in region IV is 4 CFM/$Area_{IV}$, thus the pressure in region VII can be calculated (again ignoring any headloss between region IV and region VII) as:

$$P_{VII} = P_{IV} + \frac{V_{IV}^2 \gamma}{2g} - \frac{V_{VII}^2 \gamma}{2g} =$$

$$-1.2 + \frac{16(4.72E-4)^2 *12}{2(9.8)(3.7E-2)^4} - \frac{16*(4.72E-4)^2 *12}{2(9.8)(4.5E-2)^4} = -0.5 N/m^2$$

Those skilled in the art will appreciate that the intake manifold, restriction chamber, exhaust manifold and venturi vent could be other dimensions or shapes when designing the air duct and still fall within the spirit and scope of the invention which are defined by the following claims.

What is claimed is:

1. An electronic device, comprising:
   at least one electronic component, said at least one component capable of producing a quantity of heat;
   an air-moving device, said air-moving device capable of creating a flow of air, said flow of air removing a portion of said quantity of heat from said at least one component; and
   an air duct comprising,
      a restriction chamber, said restriction chamber having a first end and a second end, and said restriction chamber having at least one venturi vent 120,
      an intake manifold, said intake manifold capable of being operatively engaged to said flow of air and further operatively engaged to said first end of said restriction chamber, and an exhaust manifold coupled to said second end of said restriction chamber;

wherein said at least one venturi vent creates a vacuum air flow, and wherein said vacuum air flow does not pass over said at least one component.

2. The electronic device of claim 1 further comprising at least one system component, wherein said vacuum air flow passes over said at least one system component.

3. The electronic device of claim 2 wherein said at least one system component 300 is thermally isolated from said at least one component.

4. The electronic device of claim 1 wherein said at least one component comprises a microprocessor.

5. The electronic device of claim 1 wherein said air-moving device is proximal to said exhaust manifold of said air duct.

6. The electronic device of claim 1 wherein said air moving device is a blower.

7. The electronic device of claim 1 wherein said air moving device is a fan.

8. The electronic device of claim 1, further comprising:
   a cavity 230, said cavity containing said at least one component, said cavity thermally coupled to said at least one venturi vent of said air duct.

9. The electronic device of claim 1, further comprising;
   a keyboard, said keyboard further having a cavity; and
   wherein said air-moving device creates a first air flow across said at least one component and said first air flow enters said intake manifold of said air duct, and wherein said vacuum air flow of said at least one venturi vent creates a second air flow through said cavity of said keyboard and said second air flow combines with said first air flow in said air duct before exiting through said exhaust manifold of said air duct.

10. An air duct capable of using a first air flow, the first air flow having a first velocity for cooling at least one electronic component capable of producing a quantity of heat, said air duct comprising:
   an intake manifold having a first volume comprising a first area and a first length, said first air flow operatively engaged to said intake manifold,
   a restriction chamber having an opening and a second volume comprising a second area and a second length, said second area of said restriction chamber smaller than said first area of said intake manifold, wherein said restriction chamber is coupled to said intake manifold to receive said first air flow, said first air flow having a second velocity in said restriction chamber, said second velocity larger than said first velocity, said first air flow flowing across said opening thereby creating a second air flow into said opening from external to said restriction chamber thereby forming a third air flow by combining said first air flow and said second air flow, and
   an exhaust manifold, said exhaust manifold having an exhaust opening and a third volume, said third volume having a third area and a third length, said third area of said exhaust manifold larger than said second area of said restriction chamber, said third area coupled to said second area allowing said third air flow to expand and have a third velocity, said third air flow exits said exhaust manifold through said exhaust opening; and
   wherein said first air flow mixes with said second air flow such that said second air flow does not pass over said at least one component.

11. The air duct of claim 10 wherein said opening in said restriction chamber is flared.

12. A microprocessor comprising the air duct of claim 10.

* * * * *